United States Patent [19]
Shou et al.

[11] Patent Number: 5,394,107
[45] Date of Patent: Feb. 28, 1995

[54] ABSOLUTE VALUE CIRCUIT

[75] Inventors: Guoliang Shou; Sunao Takatori; Makoto Yamamoto, all of Tokyo, Japan

[73] Assignee: Yozan Inc., Tokyo, Japan

[21] Appl. No.: 111,870

[22] Filed: Aug. 26, 1993

[30] Foreign Application Priority Data

Aug. 27, 1992 [JP] Japan .................................. 4-252196

[51] Int. Cl.⁶ .............................................. H03K 5/00
[52] U.S. Cl. ..................................... 327/354; 327/104
[58] Field of Search ............... 307/490, 491, 494, 501, 307/261; 328/26

[56] References Cited

U.S. PATENT DOCUMENTS

| | | | |
|---|---|---|---|
| 3,509,372 | 4/1970 | Bicking . | |
| 3,564,430 | 10/1970 | Brudevold | 307/261 |
| 4,446,444 | 5/1984 | Patterson, III . | |
| 4,571,502 | 2/1986 | Kimura et al. | 328/26 |
| 4,704,545 | 11/1987 | Tanaka et al. | 307/490 |
| 5,012,139 | 4/1991 | Susak et al. | 307/490 |

FOREIGN PATENT DOCUMENTS 2619265 2/1989 France .

OTHER PUBLICATIONS

Rikoski et al., "Micropower Complementary-MOS d.c. Amplifier", International Journal of Electronics, vol. 40, No. 3, 1976, pp. 237–240.
Patent Abstracts of Japan, vol. 010, No. 209, Jul. 1986, JP-A-61 050 408.

*Primary Examiner*—Timothy P. Callahan
*Assistant Examiner*—Toan Tran
*Attorney, Agent, or Firm*—Cushman, Darby & Cushman

[57] ABSTRACT

An absolute value circuit for analog type processing combines an analog inverter circuit and a maximum circuit. The inverter circuit uses an operational amplifier comprised of CMOS inverters which are connected in a cascade with a gain of 1. The maximum circuit includes a pair of nMOS transistors, the source follower outputs of which are connected to a common output.

4 Claims, 1 Drawing Sheet

ABSOLUTE VALUE CIRCUIT

FIELD OF THE INVENTION

This invention relates to an analog typed absolute value circuit outputting an absolute value of an input voltage.

BACKGROUND OF THE INVENTION

A majority of computational systems are digital computers. Typically, addition, subtraction, multiplication, division and many other calculations are performed by digital computers. Analog type processing has also recently become important as the result of neural networks and other global information processing. In digital processing, a calculation of absolute value can be realized by inverting a sign bit. However, in analog processing, an electrical value is evaluated and is to be inverted in polarity. There has not been a circuit preferable for absolute value calculation of analog type, as far as the inventors know.

SUMMARY OF THE INVENTION

The present invention is invented so as to solve the above problems and has an object to provide an analog type circuit for calculating an absolute value.

According to the present invention, the absolute circuit is a combination of an inverter circuit and maximum value circuit, the inverter circuit is an operational amplifier with a gain "1" which consists of CMOS inverters connected in a cascade, and the maximum circuit consists of a pair of nMOS transistors, the source follower outputs of which are connected to a common output.

PREFERRED EMBODIMENT OF THE PRESENT INVENTION

Hereinafter an embodiment of an absolute value circuit according to this invention is described with referring to the attached drawings.

Figure 1:
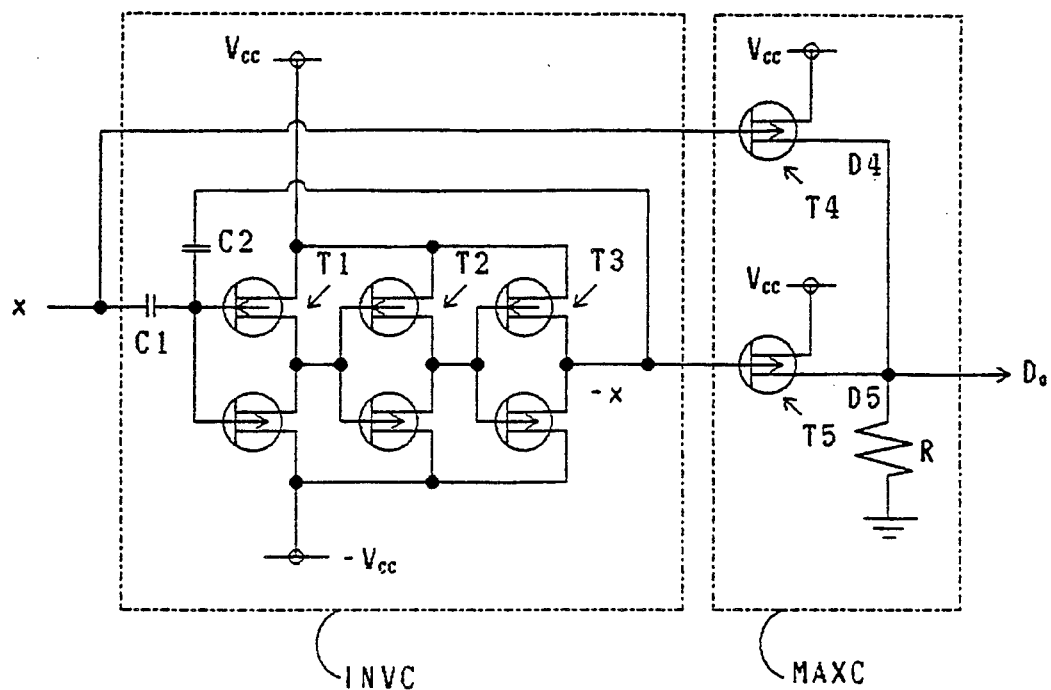
FIG. 1 is a diagram of a circuit showing an embodiment of the absolute value circuit according to the present invention.

In FIG. 1, an absolute value circuit has an inverter circuit INVC and a maximum value circuit MAXC. An output of the inverter circuit is inputted to the maximum value circuit. An input voltage x is inputted to the circuit INVC and MAXC, and a final output is outputted from MAXC.

An inverter circuit INVC consists of CMOS inverters T1, T2 and T3 connected in a cascade. The final output of the final stage CMOS inverter stage T3 is fed back to a gate of the first stage T1. An operational amplifier is constructed by the CMOS inverters from T1 to T3. An input voltage x is connected to a gate of inverter T1 through a capacitance C1, and a capacitance C2 substantially equal to C1 is connected on a feedback line from inverter T3 to inverter T1. In the inverter circuit INVC, a positive power source Vcc is connected to each drain of the pMOS transistor, and a negative power source −Vcc is connected to each source of the nMOS transistors. In such a circuit, INVC becomes an inverting operational amplifier with gain 1, and a voltage of −x with inverted sign of an input voltage x is outputted. Here, a gain of INVC is given by a ratio of capacitances C1/C2, and an outputting characteristics of gain '1' is obtained by setting C1 equal to C2.

Figure 2:
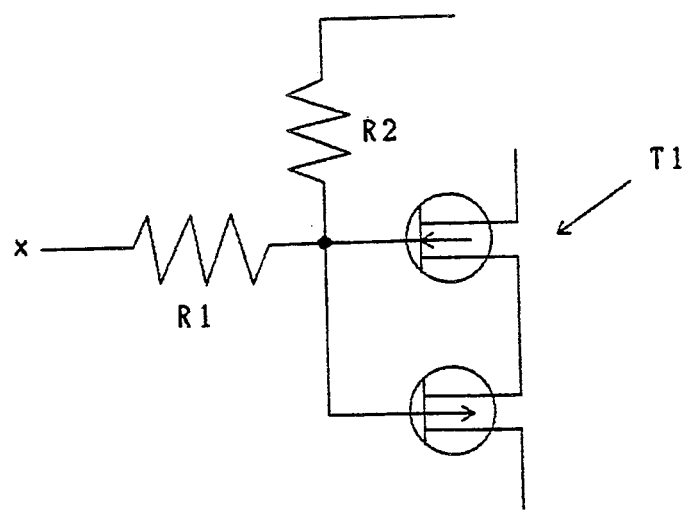
FIG. 2 is a partial circuit diagram showing another embodiment of the present invention.

The gain of INVC is defined by the ratio of the impedance for input voltage and the impedance of feedback voltage. As shown in FIG. 2, resistors R1 and R2 can be used in place of C1 and C2. The maximum value circuit MAXC includes a pair of nMOS transistors T4 and T5, source follower outputs D4 and D5 of which are connected to a common output $D_0$. The input voltage x is inputted to a gate of nMOS transistor T4 and −x from inverter T3 is inputted to a gate of nMOS transistor T5.

If MOS transistors T4 and T5 were independent, each would output at its source the voltage at its input. However, when the sources of transistors T4 and T5 are connected together, the transistor with the higher input causes the transistor with the lower input to stop conducting, since the source voltage of the transistor with the lower input becomes higher than its gate voltage. As a result, the higher input voltage is to be generated on the common output $D_0$.

x and −x are inputted to MAXC. If x is larger than 0, then x is outputted. On the other hand, if x is smaller than 0, then −x is outputted. This is the result of an absolute value calculation.

It is easy to cooperate with other analog calculating circuits because it can execute an absolute calculation by using an analog input as it is.

The time for obtaining these outputs is equal to the response time of four stage CMOS circuitry, and the calculation speed is much higher than that of digital circuit. It is clear that the size of the circuit is very small.

An absolute value circuit according to this invention combines an analog type inverter circuit and a maximum value circuit. The inventer circuit uses an operational amplifier consisting of CMOS inverters connected in a cascade with a gain of "1". The maximum value circuit consists of a pair of nMOS transistors. The source follower outputs thereof are connected to a common output. The invention is advantageous since cooperation with an analog type calculating circuit is easy.

What is claimed is:

1. An absolute value circuit comprising:
   i) an inverter circuit to which an input voltage is applied;
   ii) a first nMOS transistor having a gate to which an output of said inverter circuit is applied, a drain connected to a power supply and a source forming a source follower output;
   iii) a second nMOS transistor having a gate to which said input voltage is applied a drain connected to a power supply and a source forming a source follower output; and
   iv) a common output to which said source follower outputs of said first and second nMOS transistors are connected.

2. An absolute value circuit as claimed in claim 1 wherein:
   i) said inverter circuit comprises a plurality of CMOS inverters connected in a cascade;
   ii) each drain of a PMOS transistor in each of said CMOS inverters is connected to a power source of a positive voltage, and each source of a nMOS transistor in each of said CMOS inverters is connected to a source of negative voltage with an absolute value equal to said positive voltage;

iii) an output of a final stage of said CMOS inverters is fed back to a gate of a first stage of said CMOS inverters through a first impedance; and iv) said input voltage being inputted to said first stage of said CMOS inverters through second impedance substantially equal to said first impedance.

3. An absolute value circuit as claimed in claim 2, wherein said each of impedances is a capacitance.

4. An absolute value circuit as claimed in claim 2, wherein said each of impedances is a resistance.

* * * * *